United States Patent
Cano et al.

(10) Patent No.: US 9,857,071 B2
(45) Date of Patent: *Jan. 2, 2018

(54) ELECTRIFIED MEDICINE CABINET

(71) Applicant: American Glasscrafters, Inc., Carlstadt, NJ (US)

(72) Inventors: Joseph F. Cano, Ridgewood, NJ (US); Michael B. Balagyozyan, Wayne, NJ (US); Robert P. Pandorf, Yardley, PA (US)

(73) Assignee: American Glasscrafters, Inc., Carlstadt, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/466,902

(22) Filed: Mar. 23, 2017

(65) Prior Publication Data
US 2017/0191653 A1   Jul. 6, 2017

Related U.S. Application Data

(63) Continuation of application No. 14/826,733, filed on Aug. 14, 2015, now Pat. No. 9,644,834.

(51) Int. Cl.
*F21V 33/00* (2006.01)
*F21S 4/20* (2016.01)
(Continued)

(52) U.S. Cl.
CPC .......... *F21V 33/0012* (2013.01); *A47B 67/02* (2013.01); *F21S 4/20* (2016.01);
(Continued)

(58) Field of Classification Search
CPC .... F21V 33/0012; F21V 23/002; F21V 23/02; F21S 4/20; A47B 67/02; H01R 24/62;
(Continued)

(56) References Cited

U.S. PATENT DOCUMENTS 3,839,620 A   10/1974   Seibel
4,940,317 A    6/1990   Reuben
(Continued)

FOREIGN PATENT DOCUMENTS

GB      530147      12/1940
GB    2350549 A    12/2000
JP   2008/136736    6/2008

*Primary Examiner* — Laura Tso
(74) *Attorney, Agent, or Firm* — Richard Malagiere, Esq.

(57) ABSTRACT

A medicine cabinet with a horizontally oriented internal wire management and electronic component raceway structure where electrical wires from the building or home power supply and electronic components are housed. The uppermost portion of the internal wire management and electronic component raceway structure forms a shelf in the medicine cabinet with a translucent shelf surface. An LED light strip inserted inside the internal wire management and electronic component raceway activated by a motion sensor switch provides illumination in the cabinet through the translucent shelf. Electrical receptacles and USB ports protrude from the front face of the shelf/wire management and electronic component raceway shelf. These receptacles and ports are powered by the electrical wires from the house or building fed into the shelf/wire management and electronic component raceway. Defogger strips are located between the two mirrored faces of the cabinet door. These defogger strips are powered by electrical receptacles located on the bottom of each side of the shelf/wire management and electronic component raceway housing allowing the mirrored cabinet doors to be mounted on either the left or right side of the medicine cabinet.

6 Claims, 6 Drawing Sheets

(51) Int. Cl.
*F21V 23/00* (2015.01)
*F21V 23/02* (2006.01)
*A47B 67/02* (2006.01)
*H05K 5/03* (2006.01)
*H05K 5/02* (2006.01)
*H01R 24/62* (2011.01)
*H05K 7/14* (2006.01)
*F21W 131/301* (2006.01)
*F21Y 115/10* (2016.01)
*F21Y 103/10* (2016.01)
*H01R 107/00* (2006.01)

(52) U.S. Cl.
CPC ............ *F21V 23/002* (2013.01); *F21V 23/02* (2013.01); *H01R 24/62* (2013.01); *H05K 5/0226* (2013.01); *H05K 5/03* (2013.01); *H05K 7/14* (2013.01); *F21W 2131/301* (2013.01); *F21Y 2103/10* (2016.08); *F21Y 2115/10* (2016.08); *H01R 2107/00* (2013.01)

(58) Field of Classification Search
CPC .... H01R 2107/00; H05K 5/0226; H05K 5/03; H05K 7/14; F21Y 2103/10; F21Y 2115/10; F21W 2131/301

USPC ......................................... 362/133, 234, 253
See application file for complete search history.

(56) References Cited

U.S. PATENT DOCUMENTS

| | | | |
|---|---|---|---|
| 5,287,252 A | 2/1994 | Caruso | |
| 5,577,819 A | 11/1996 | Olsen | |
| 5,731,569 A | 3/1998 | Crescenzo | |
| 6,365,876 B1 | 4/2002 | Park | |
| 6,420,682 B1 | 7/2002 | Sellgren | |
| 8,215,795 B2 | 7/2012 | Pichel | |
| 8,562,167 B1 * | 10/2013 | Meier | A47B 96/021 362/125 |
| 9,644,834 B2 | 5/2017 | Cano | |
| 9,675,172 B2 | 6/2017 | Pandorf | |
| 2003/0042828 A1 | 3/2003 | Bonin | |
| 2007/0120451 A1 | 5/2007 | Lamar | |
| 2007/0159035 A1 * | 7/2007 | Mullen | A47B 46/005 312/245 |
| 2010/0270438 A1 | 10/2010 | Pandorf | |
| 2010/0282629 A1 | 11/2010 | Greia | |
| 2016/0047539 A1 | 2/2016 | Cano et al. | |

* cited by examiner

ELECTRIFIED MEDICINE CABINET

PRIORITY

This application claims priority to pending U.S. Nonprovisional application Ser. No. 14/826,733 filed Aug. 24, 2015 which in turn claimed priority to Provisional Application No. 62/037,622 filed Aug. 15, 2014.

BACKGROUND OF INVENTION

The present invention is directed toward storage cabinets such as medicine cabinets. More particularly, it is directed to improvements in positioning and storing electrical wiring and electronic components for these cabinets in a shelf system in the cabinet.

Medicine cabinets are most often used to store cosmetic items and like kind personal items and medications. Some medicine cabinets are equipped with electrical power to power a light on or in the cabinet and/or provide power for an electrical receptacle.

Prior art cabinets provide for a receptacle on the outside of the cabinet so that an item plugged into the receptacle can be operated with the door opened or closed. This configuration constantly exposes the receptacle—located outside the cabinet—to moisture in the air in the bathroom environment. Additionally, the location of an electrical receptacle on the outside of the cabinet is unsightly.

Alternative arrangements in medicine cabinets have placed the receptacle inside the cabinet with the associated wiring arranged in a vertical race in the cabinet. Such arrangements work to break up the storage and shelf space in the medicine cabinet in an undesirable way.

Accordingly, there exists a need for improving such storage cabinets and addressing these concerns.

BRIEF SUMMARY OF INVENTION

According to one embodiment of the present invention, there is provided a storage cabinet in the specific form of a medicine cabinet. The medicine cabinet has an outer housing having opposed side walls, an openable front door and in internal storage cavity between the opposed walls. There is a shelf positioned horizontally between the vertical opposed walls that also functions as an internal wire management and electronic component raceway. This shelf/wire storage and electronic component raceway also acts as a frame for an LED strip light shining through a translucent shelf cover piece energized by a power source housed in the shelf/wire storage and electronic component raceway. The LED strip light is turned on and off when the cabinet door is opened and closed by means of a motion sensor switch located in the face of the shelf/wire storage and electronic component raceway.

In one embodiment, electrical wiring is linkable to an external power source in the home or building in which the cabinet is located and the other end of the wiring connected to the electrical outlets and components in the cabinet. An alternating current to direct current transformer is inserted into the cabinet to allow for direct current power to flow to USB ports. A power source energized by the external power source of the house or building is inserted into the cabinet for the LED strip light. Two of the electrical outlets and the USB ports are located below the shelf on the outer face of the shelf/wire management and electronic component raceway. Two other electrical outlets are located on the bottom of the shelf/wire management and electronic component raceway to allow an electrical heat trace device inserted between the mirrored inner and out surfaces of the cabinet door to be plugged in.

It should be noted that the electrical receptacles, USB ports and LED light strip motion sensor switches are located at both the left and right sides of the cabinet to provide for convenient access with either a left or right mounted cabinet door. Additionally, the cabinet door is mirrored on both sides to provide a reflective service to someone using an electrical device (e.g., an electric tooth brush, electric shaver or hairdryer) plugged into the receptacle mounted in the horizontal shelf/wire storage raceway inside the medicine cabinet.

DETAILED DESCRIPTION OF INVENTION

The Present invention will now be described in terms of the presently preferred embodiment thereof as illustrated in the drawings. Those of ordinary skill in the art will recognize that many obvious modifications may be made thereto without departing from the spirit or scope of the present invention.

Figure 1:
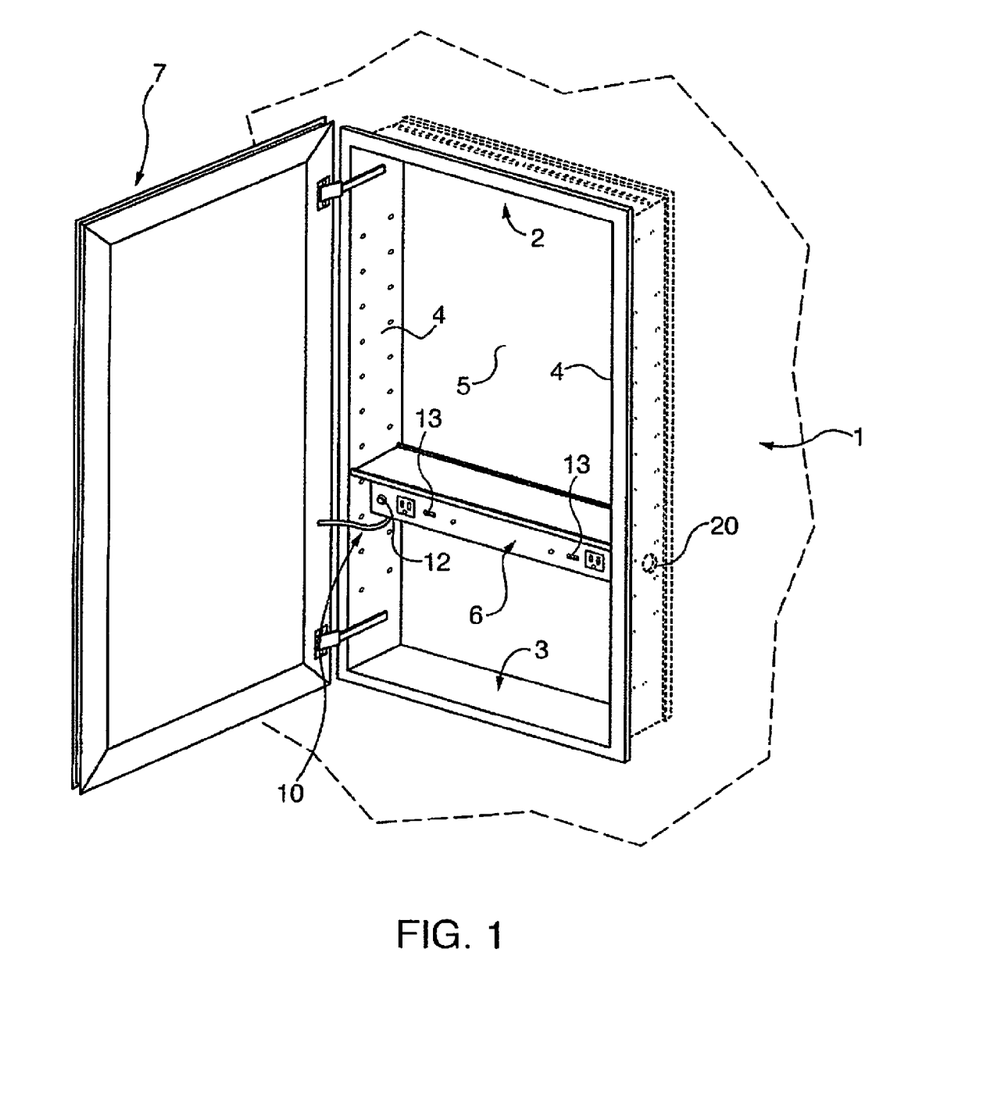
FIG. 1 is perspective view of a medicine cabinet of the present invention with a left side door mount shown open.
Figure 2:
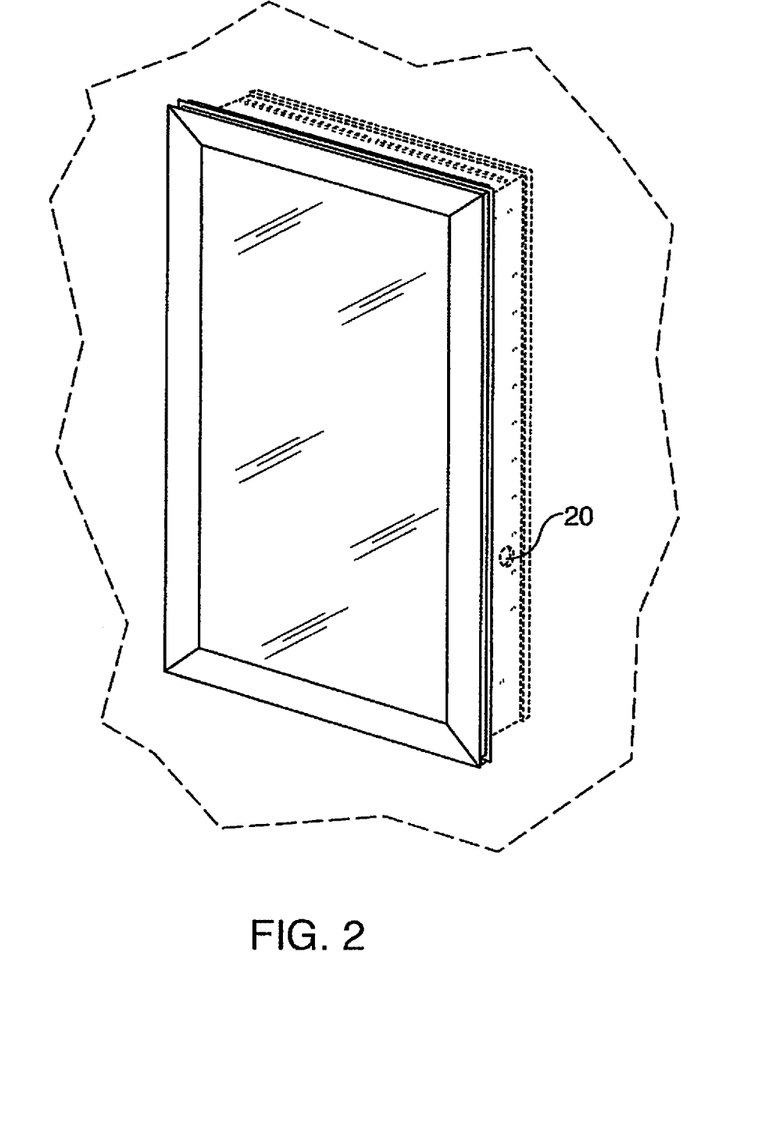
FIG. 2 is a perspective view similar to FIG. 1 with the cabinet door closed.
Figure 3:
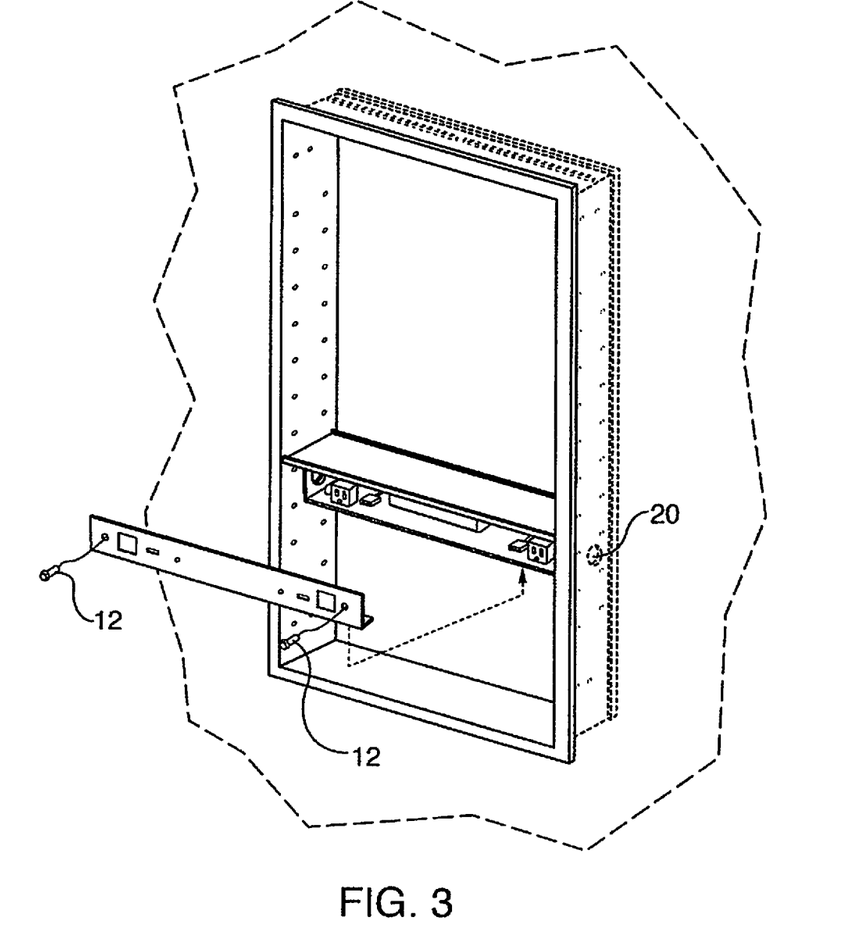
FIG. 3 is a broken out partial assembly front perspective showing certain elements of the present invention.

There is shown a medicine cabinet 1, having a top wall 2, a bottom wall 3, opposed side walls 4 and a rear wall 5, which together form an internal cavity. A shelf located inside the medicine cabinet additionally functions as a wire management and electronic component raceway 6. A front door 7 is mounted to hinges located on the medicine cabinet on either the right side edge or left side edge of the cabinet. Both the outside and inside faces of the front door contain mirrored surfaces. FIG. 1.

The cabinet can be mounted to a wall using brackets or other attachment devices. Also, while the preferred embodiment of the present invention is a medicine cabinet, it should be appreciated that they will also be valuable in the context of other cabinets, such as kitchen cabinets, tool chests and other similar applications.

Figure 6:
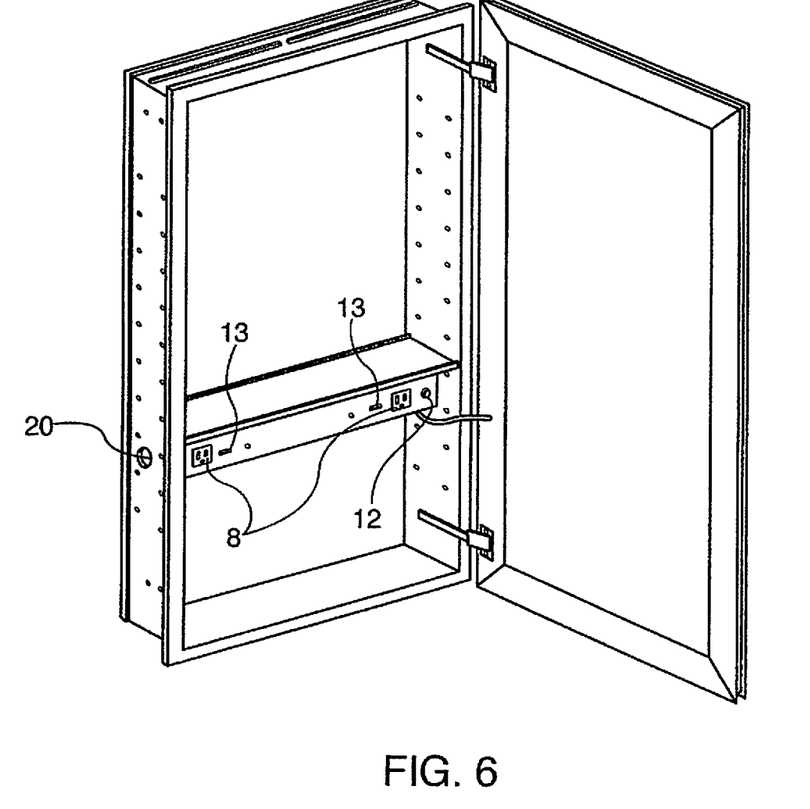
FIG. 6 is perspective view of a medicine cabinet of the present invention with a right side door mount shown open.

Shelves in the cabinet, other than the one shelf operating as the wire management and electronic component raceway, are positionable vertically within the cabinet based upon the user's storage needs. FIG. 1 and FIG. 6.

Standard electrical outlet receptacles 8 are positioned on the front face of the horizontal shelf/wire management and electronic component raceway. The electrical outlet receptacles are positioned one on the right side of the horizontal shelf/wire management and electronic component raceway and one on the left. FIG. 1 and FIG. 6. These electrical outlets are designed to be used to power grooming appliances such as, but not limited to, as an electric tooth brush or electric shaver. These items can remain plugged-in to these receptacles for charging or convenience when the cabinet door is closed.

Figure 4:
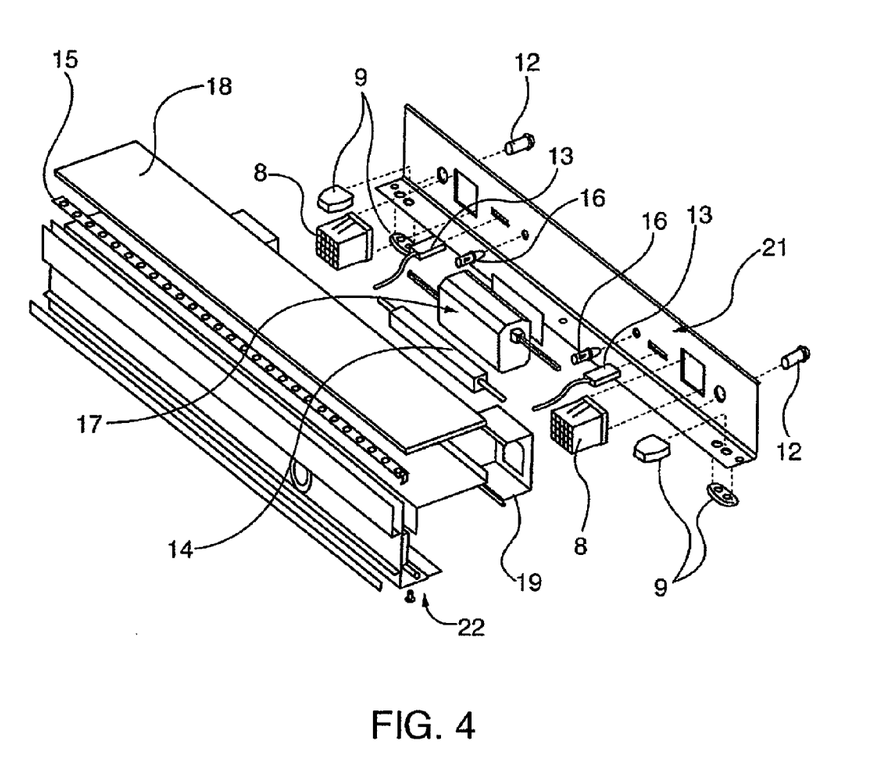
FIG. 4 is a broken out assembly of the shelf/wire management and electronic component race element of the present invention.

Also, two two-prong small elliptical receptacles 9, such as those produced by EMF, are positioned on the bottom of the horizontal shelf/wire management and electronic component raceway. FIG. 4. These bottom-mounted electrical outlets are positioned one on the right side of the horizontal shelf/wire management and electronic component raceway and one on the left. FIG. 4. Each of these bottom-mounted receptacles is intended to provide power to a power cord 10 for a heating element in the mirrored cabinet door acting as a defogger for the glass in the door. FIG. 1. This configuration allows for the mirrored cabinet door to be mounted on either the left or right side of the cabinet. FIG. 1 and FIG. 6.

Each of these bottom mounted receptacles is operated by a push activated switch 12 located in the face of the horizontal shelf/wire management and electronic component raceway to power the electrical defogger mechanism located between the mirror plates in the cabinet door. FIG. 1, FIG. 3, FIG. 4, FIG. 5 and FIG. 6. Specifically, the switch located on the left side of the horizontal shelf/wire management and electronic component raceway operates the bottom mounted electrical outlet receptacle located on left side of the horizontal shelf/wire management and electronic component raceway. FIG. 1. Similarly, the switch located on the right side of the horizontal shelf/wire management and electronic component raceway operates the bottom mounted electrical outlet receptacle located on right side of the horizontal shelf/electrical wire management raceway. FIG. 6.

Figure 5:
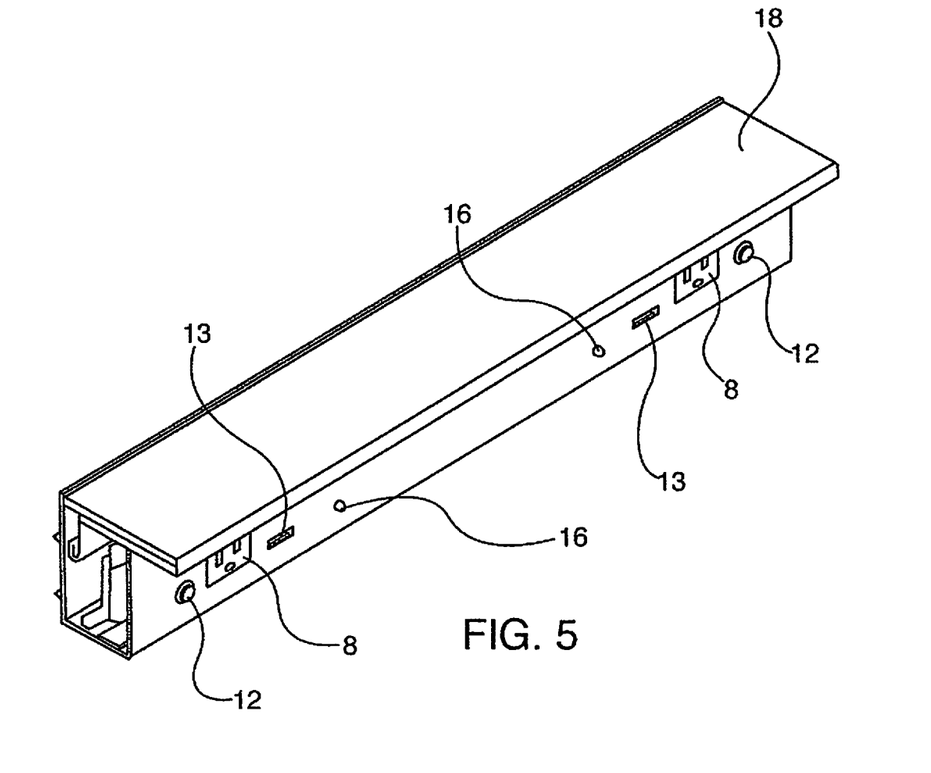
FIG. 5 is a shelf/wire management and electronic component race assembly removed from the medicine cabinet.

Universal Serial Bus (USB) ports 13 are located on the face of the horizontal shelf/wire management and electronic component raceway. FIG. 5. There is one USB port on the left side and one on the right side of the horizontal shelf/wire management and electronic component raceway. FIG. 5. These USB ports provide direct current to devices plugged into them. As such, the 110 volt alternating current feeding the cabinet is transformed into direct current by means of a transformer and voltage regulator 14 and then fed into each USB port. FIG. 4.

A light emitting diode (LED) strip light 15 is affixed inside the horizontal shelf/wire management and electronic component raceway oriented to shine up at the shelf cover affixed to the top of the horizontal shelf/wire management and electronic component raceway. FIG. 5. This LED strip light operates to illuminate the inside of the cabinet when the cabinet door is opened by motion detector switches 16 mounted on the front face of the horizontal shelf/wire management and electronic component raceway. FIG. 5. A motion sensing switch powering the LED strip light is located on each side of the front face of the horizontal shelf/wire management and electronic component raceway to allow for the mirrored door to be mounted on either the right or left side of the cabinet. FIG. 5. The LED strip light 15 is powered by an LED power source, like the APV-12-12 LED Power Supply 17, mounted inside the horizontal shelf/electrical wire management raceway. This power source is powered by the incoming 110 volt alternating current building or home source. FIG. 4.

As shown in FIG. 4, the horizontal shelf/electrical wire management raceway is a largely rectangular space which provides room to house the various electrical components and wires necessary to provide the electrical items with power in the current embodiment of the invention. The top portion of the shelf/electrical wire management raceway is a translucent rectangular piece 18 which affixes to the back of the cabinet and the opening left by the assembled shelf/wire management and electronic component raceway when installed into the cabinet. In this way, the electrical components and wires are kept secured in a plastic nonconductive enclosure out of sight and out of reach of the user. The top of this structure works as a translucent shelf through which the LED light strip provides lighting.

Referring to FIG. 4, each electrical outlet 8 is fitted into a three sided rectangular extrusion 19 fitted into the back internal portion of the cavity below the translucent shelf 18. The electrical outlets 8 are powered by the house or building power supply fed through the openings 20 in the vertical walls of the cabinet. During assembly of the shelf/wire management and electronic component raceway 6, the electrical outlets 8 are inserted through the aligned square shaped openings in the rectangular housings and then inserted through the face panel 21 to allow access to them in the assembled item. FIG. 4 and FIG. 5.

The USB ports 13 are inserted through the face panel 21 and secured by clips or other fastening method on the USB port which attach to the inner wall of the face panel 21. FIG. 4. The defogger push switches 12 and the motion sensor eyes 16 are attached to the inner wall of the face panel 21 by means for a screw and nut arrangement or a clip and insert arrangement. FIG. 4. The under mounted electrical receptacles 9 for the mirrored door defogger plug 10 are inserted through the bottom panel 21 making up the shelf/wire management and electronic component raceway. These are attached by either a screw and nut or a clip and insert arrangement. FIG. 4.

As shown in FIG. 1 and FIG. 6, one or more openings 20 are provided in the right or left vertical side walls 4 to permit the entry of wiring from a building or home power supply into the shelf/wire management and electronic component raceway. The supply electric from the building or home power supply can be routed in numerous ways including but not limited to standard wire terminals or breakers and then split off to power the various electrical receptacles and electronic devise disclosed.

The shelf/wire management and electronic component raceway is constructed of lengths of extruded of aluminum or other suitable material. FIG. 4. Slots are molded or machined into the extrusions to allow for the mating of the parts. The bottom and front of the shelf/wire management and electronic component raceway is one piece 21 with two sides oriented at approximately 90 degrees. FIG. 4. This portion of the assembly is first attached to the back of the cabinet by means of a slot located in the back of the cabinet 22 configured to accept this one piece bottom and front piece. Once attached to the back of the cabinet, this piece is rotated into its final position creating the frame for the translucent shelf 18. This portion is attached by screws to the cabinet assembly. FIG. 4.

Those of ordinary skill in the art will recognize that the embodiments just described merely illustrate the principles of the present invention. Many obvious modifications may be made thereto without departing from the spirit or scope of the invention as set forth in the appended claims.

What is claimed is:
1. A medicine cabinet, comprising:
an outer housing having opposed vertical and horizontal side walls, a side openable front door, and internal storage cavity between the opposed side walls; and
a horizontally extending wire management and electronic component raceway positioned between the opposed vertical side walls so as to define a storage area in the cavity between the top and bottom of the wire management raceway, wherein the wire management and component raceway has an internal area that houses wires and electronic components;
a shelf in the storage cabinet defined by the horizontally extending wire management and electronic component raceway positioned between the opposed vertical side walls.

2. The storage cabinet in claim 1, wherein one end of a home or building electrical wiring is linkable to an external power source, and another end of the electrical wiring is linked to electrical outlets, a transformer to power USB ports and a power source feeding a LED strip light.

3. The storage cabinet in claim 2, wherein the electrical outlets and the USB ports are positioned on an outer face of the wire management and electronic component raceway.

4. The storage cabinet in claim 2, wherein the transformer powering the USB port is positioned in the cavity created by the wire management and electrical component raceway.

5. The storage cabinet in claim 2, wherein the power source for the LED strip light is positioned in the cavity created by the wire management and electrical component raceway.

6. A storage cabinet, comprising:
an outer housing having opposed vertical and horizontal side walls, a side openable front door, and internal storage cavity between the opposed side walls; and
a horizontally extending wire management and electronic component raceway positioned between the opposed vertical side walls so as to define a storage area in the cavity between the top and bottom of the wire management raceway, wherein the wire management and component raceway has an internal area that houses wires and electronic components;
a shelf in the storage cabinet defined by the horizontally extending wire management and electronic component raceway positioned between the opposed vertical side walls;
one end of a home or building electrical wiring is linkable to an external power source, and another end of the electrical wiring is linked to electrical outlets, a transformer to power USB ports and a power source feeding a LED strip light;
the LED strip light is positioned in the shelf created by the wire management and electrical component raceway and oriented to shine up through the shelf to illuminate the inside of the cabinet.

* * * * *